US009175842B2

(12) United States Patent
Jokelainen et al.

(10) Patent No.: US 9,175,842 B2
(45) Date of Patent: Nov. 3, 2015

(54) HEAT SINK ASSEMBLY FOR OPTO-ELECTRONIC COMPONENTS AND A METHOD FOR PRODUCING THE SAME

(75) Inventors: Kimmo Jokelainen, Turenki (FI); Ville Moilanen, Oulu (FI); Howard Rupprecht, Espoo (FI)

(73) Assignee: Light Therm Oy, Oulu (FI)

( * ) Notice: Subject to any disclaimer, the term of this patent is extended or adjusted under 35 U.S.C. 154(b) by 0 days.

(21) Appl. No.: 14/001,967

(22) PCT Filed: Mar. 8, 2012

(86) PCT No.: PCT/FI2012/000014
§ 371 (c)(1),
(2), (4) Date: Aug. 28, 2013

(87) PCT Pub. No.: WO2012/120185
PCT Pub. Date: Sep. 13, 2012

(65) Prior Publication Data
US 2013/0335970 A1    Dec. 19, 2013

Related U.S. Application Data

(60) Provisional application No. 61/450,187, filed on Mar. 8, 2011.

(30) Foreign Application Priority Data

Mar. 8, 2011    (GB) .................... 1103850.2

(51) Int. Cl.
*F21V 29/00*    (2015.01)
*F21V 29/71*    (2015.01)
(Continued)

(52) U.S. Cl.
CPC ................ *F21V 29/22* (2013.01); *F21V 29/70* (2015.01); *F21V 29/713* (2015.01); *F21V 29/85* (2015.01);
(Continued)

(58) Field of Classification Search
CPC ....... F21V 29/22; F21V 29/24; F21V 29/244; F21V 23/06; F21V 29/2275; F21V 29/71; F21V 29/713; F21V 29/717; F21V 29/89; F21V 29/2279; F21Y 2101/02; H01L 33/64; F21K 9/1355; F21K 9/135; F21K 9/13; F21K 9/137
USPC ............ 313/46, 248, 475; 362/218, 294, 373, 362/547, 249.02, 249.01, 249.06, 249.05; 361/709–713; 257/99, 720
See application file for complete search history.

(56) References Cited

U.S. PATENT DOCUMENTS 3,133,703 A *    5/1964    Monroe .................. 362/658
7,268,479 B2 *    9/2007    Aisenbrey ............... 313/475
(Continued)

FOREIGN PATENT DOCUMENTS

CN    101419962 A        4/2009
CN    101419962 B    *   11/2011
(Continued)

OTHER PUBLICATIONS

Dow Plastics, Form No. 296-00279-1098, Oct. 1998, The Dow Chemical Company, p. 12.*
(Continued)

*Primary Examiner* — Anh Mai
*Assistant Examiner* — Arman B Fallahkhair

(57)    ABSTRACT

The invention relates to a heat sink assembly and a method for producing the same. The invention can be applied, for example, in solid state lighting in order to improve the efficiency of heat dissipation. The object of the invention is achieved with a solution where effective thermal connection is provided from opto-electrical component in which thermally active inserts are embedded in an injection moulding to plastic heat sink. Solution of the invention can also provide also electrical connections for opto-electrical components.

25 Claims, 8 Drawing Sheets

(51) Int. Cl.
*F21V 29/70* (2015.01)
*F21V 29/85* (2015.01)
*F21Y 101/02* (2006.01)

(52) U.S. Cl.
CPC ..... *B29K 2995/0013* (2013.01); *F21Y 2101/02* (2013.01); *H01L 2224/48091* (2013.01); *H01L 2224/73265* (2013.01); *Y10T 29/49117* (2015.01)

(56) References Cited

U.S. PATENT DOCUMENTS

| | | | |
|---|---|---|---|
| 7,819,553 B2* | 10/2010 | Lexso | 362/249.14 |
| 7,993,031 B2* | 8/2011 | Grajcar | 362/294 |
| 8,071,998 B2* | 12/2011 | Chen | 257/99 |
| 8,143,769 B2* | 3/2012 | Li | 313/46 |
| 8,371,722 B2* | 2/2013 | Carroll | 362/311.02 |
| 8,408,747 B2* | 4/2013 | Wang et al. | 362/294 |
| 8,596,827 B2* | 12/2013 | Phipps et al. | 362/294 |
| 8,616,714 B2* | 12/2013 | Lee et al. | 362/84 |
| 2003/0051867 A1 | 3/2003 | Kennedy | |
| 2006/0098440 A1* | 5/2006 | Allen | 362/294 |
| 2006/0274529 A1* | 12/2006 | Cao | 362/294 |
| 2008/0008216 A1 | 1/2008 | Miller | |
| 2009/0086492 A1 | 4/2009 | Meyer | |
| 2009/0255660 A1 | 10/2009 | Cornie | |
| 2009/0322800 A1 | 12/2009 | Atkins | |
| 2011/0030920 A1* | 2/2011 | Qin et al. | 165/80.3 |
| 2011/0103080 A1* | 5/2011 | Kalhoff | 362/382 |
| 2011/0242816 A1 | 10/2011 | Chowdhury | |

FOREIGN PATENT DOCUMENTS

| | | |
|---|---|---|
| EP | 2251915 A1 * | 11/2010 |
| WO | 2009153031 A1 | 12/2009 |
| WO | 2011137355 A1 | 11/2011 |

OTHER PUBLICATIONS

International Search Report, PCT/FI2012/000014, mailed Aug. 31, 2012.

Written Opinion of International Searching Authority; PCT/FI2012/000014, mailed Aug. 31, 2012.

* cited by examiner

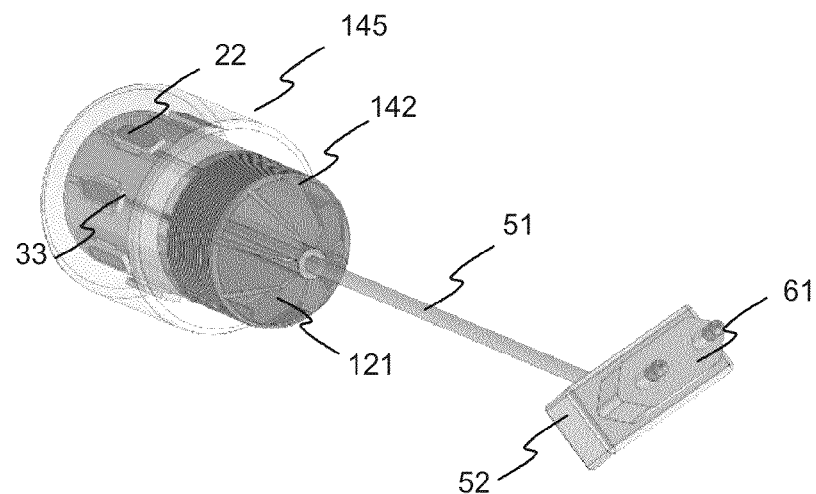
FIG. 11
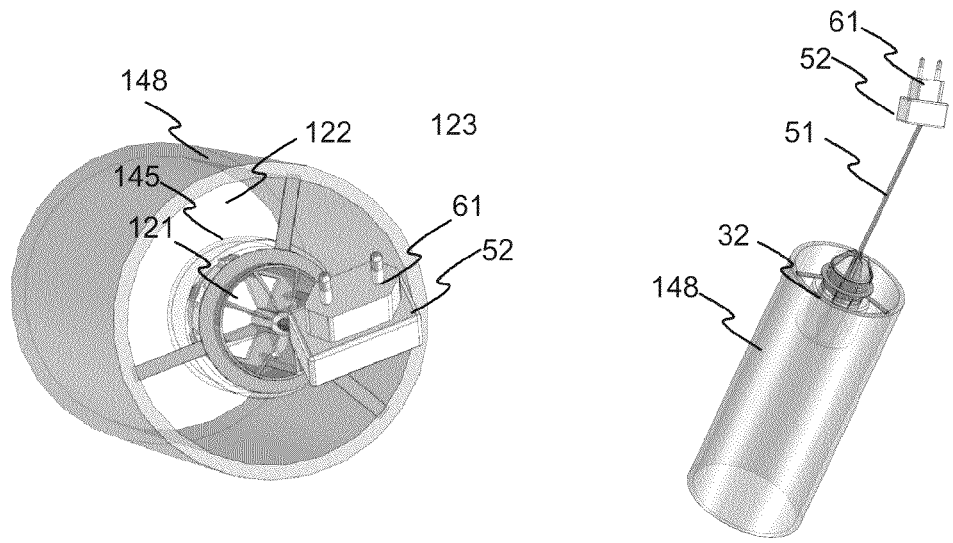
FIG. 12a  FIG. 12b

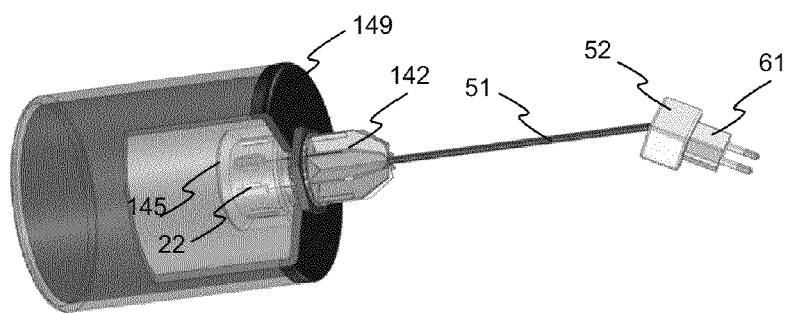
FIG. 13
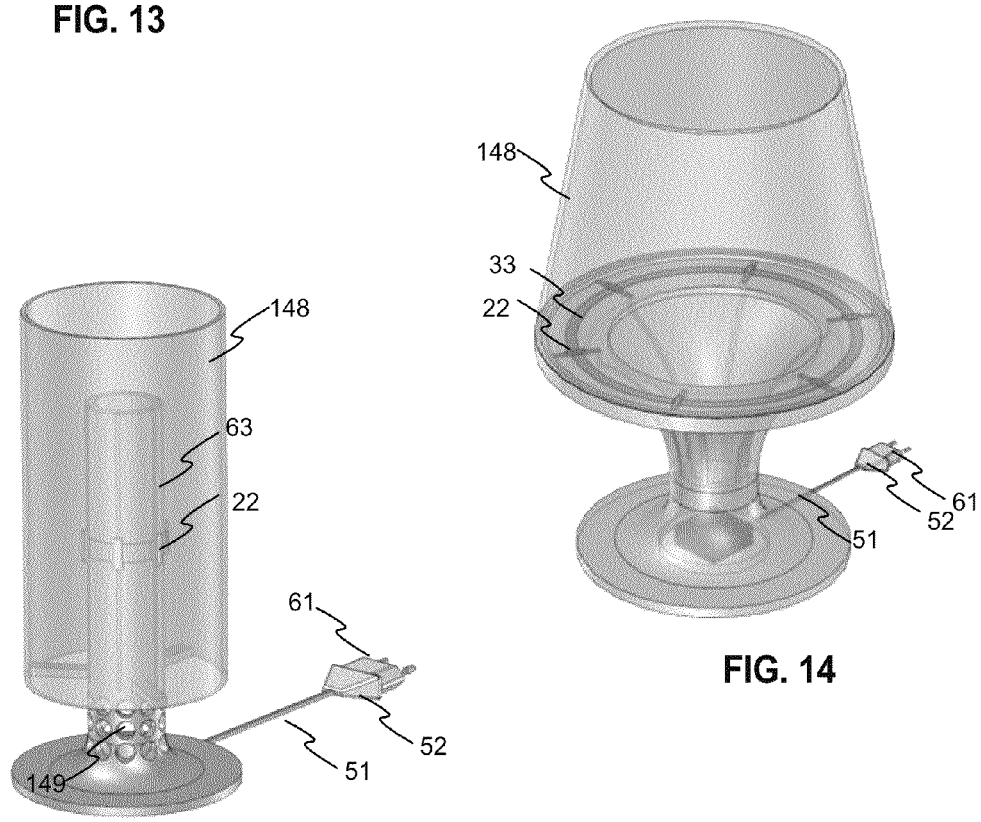
FIG. 14
FIG. 15

HEAT SINK ASSEMBLY FOR OPTO-ELECTRONIC COMPONENTS AND A METHOD FOR PRODUCING THE SAME

TECHNICAL FIELD

The invention relates to a heat sink assembly for opto-electronic components and a method for producing the same. Moreover, the invention relates to the thermal management of such assembly. The invention can be applied in, for example, in solid state lighting in order to provide efficient heat dissipation.

BACKGROUND TECHNOLOGY

The invention is not limited to any certain applications, but as an example, we discuss the technology of LED replacement light bulbs. Due to poor efficiency of incandescent lighting there is a tendency to increase the use of LEDs instead of incandescent light bulbs. Incandescent light bulbs can be easily replaced by using LED replacement light bulbs. They are electrically and mechanically compatible with incandescent light bulbs but use less electrical energy for producing a certain luminous flux.

Figure 1:
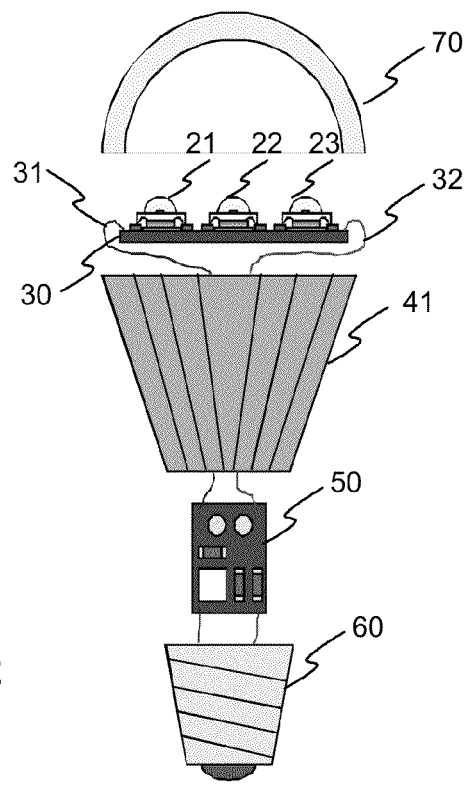

FIG. 1 illustrates main parts of an exemplary prior art LED replacement light bulb. It has three LEDs 21, 22, 23, which are mounted on a MCPCB (Metal Core Printed Circuit Board) 30. The MCPCB is electrically connected to a power supply 50 with wires 31, 32. The power supply is further connected to light fitting 60, which is an electrical and mechanical interface of the device. The LEDs generate heat which must be dissipated efficiently in order to keep the temperatures of the LEDs at a moderate level. FIG. 1 illustrates a heat sink 41, which is made of aluminium, for example. The MCPCB is attached to the heat sink with temperature interface material. The heat dissipated from the LEDs is first conducted to the MCPCB and further to the heat sink. The device also has a translucent cover 70.

There are certain problems related to the prior art solutions for dissipating heat from electrical components such as LEDs. The dissipation of heat is not efficient when the heat is conducted through several thermal interfaces between different parts, such as LED—MCPCB—heat sink, and interface materials in between, such as thermal interface materials like silicon grease between the MCPCB and heat sink. Heat conductivity of a MCPCB is also relatively low because the heat is conducted through insulating dielectric layer i.e. MCPCB dielectric laminate. Due to the inefficient heat dissipation the opto-electronic components, such as LEDs, cannot be used with a maximum or even with a high power. Therefore, in order to achieve a certain power level, it is required to provide larger amount of opto-electronic components, which also adds to the production cost of a device. The inefficient thermal connection limits also the integration density of LEDs, i.e. due to inefficient thermal connection LEDs close to each other start to heat up each other.

The more inefficient i.e. higher the thermal resistance of connection between the component and heat sink is, the smaller thermal resistance of the heat sink can be, which means relatively large heat sinks or active cooling. Therefore it is sometimes not possible to design the devices into a desired size. Prior art heat sinks are generally made of metal, such as aluminium. In order to raise the emissivity it is beneficial to provide anodizing or other kind of coating for the metal heat sink, which causes costs. The cost of the heat sink and MCPCB is relatively high compared to other components of a LED replacement bulb, for example.

It is a known solution to use plastic heat sinks. However, the interconnection of electrical structures to plastic heat sinks uses MCPCB or other PCB solutions attached with some thermal interface material to plastic heat sinks, where some solution needs to be provided, in order to provide planar surfaces in between the MCPCB and the heat sink. Planar surface in between is needed to provide efficient thermal connection.

A further disadvantage of the prior art assemblies relates to complicated production processes. It is typically necessary to connect a MCPCB to a power supply with wires and to use manual assembly with possible thermal interface materials for attaching the MCPCB with a heat sink. When the heat sink assembly includes a heat sink made of aluminium as well as a PCB the weight of the heat sink assembly tends to become high.

A typical LED replacement bulb solution assembled to a standardized lamp socket has a problem of providing poor and/or disturbed air flow for the heat sink of the replacement bulb. This is due to the optical surface also requiring large surface area, which is thus reduced from the heat dissipating area. The optical surface area is needed to meet the requirements set for the replacement bulbs. Requirements include e.g. omni directionality. Another air flow disturbing and heat dissipating surface minimizing factor is the volume that the power supply requires in the standardized socket LED replacement solutions. This volume reservation reduces the volume available for arranging the heat dissipating surface. Also, the standardized base is a closed structure, not allowing air to flow. Another problem with the standard base/socket is poor conduction of heat through the base/socket to the luminaire structure.

SUMMARY OF THE INVENTION

The purpose of the present invention is to avoid or reduce disadvantages of the prior art.

The object of the invention is achieved with a solution, in which thermally active inserts are embedded in an injection moulded plastic heat sink. Thermally active inserts are used for spreading the heat in effective way to heat dissipating injection moulded heat sink. Also electrically active inserts can be used for electrical connections between components. The inserts are preferably made of metal. The inserts have preferably surface areas which enable inter-metallic connection such as soldering or bonding. Such a contact has a good thermal and electrical conductivity.

Heat sink assembly according to the invention for dissipating heat from at least one opto-electronic component, characterised in that the assembly comprises:
  an injection moulded, plastic heat sink,
  at least one thermally active insert embedded at least partly inside the heat sink,
  an exposed area at a surface of the thermally active insert(s) for thermal connection to the opto-electronic component(s), and
  a thermal connection between the thermally active insert and the heat sink,
wherein the thermally active insert is arranged to distribute thermal energy from the opto-electronic component to the heat sink.

A method according to the invention for producing a heat sink assembly for at least one opto-electronic component, is characterised in that
  thermally active inserts are produced of thermally conductive material,
  a plastic heat sink is injection moulded, one or several thermally active inserts are embedded during the phase of injection moulding at least partly inside the heat sink for providing a thermal contact between the thermally active insert and the heat sink, an area of the thermally active insert is exposed for providing a thermal contact between the opto-electronic component and the thermally active insert.

Some preferable embodiments of the invention are described in the dependent claims.

Thermally active inserts conduct and disperse effectively the heat from a heat generating electrical component, die or module to heat dissipating plastic heat sink. Thermally active inserts remove the thermal bottle necks between component and heat dissipating surface on moulded insert heat sink structure. Shape of the thermally active insert can be free; its purpose is to disperse the heat effectively and evenly into the moulded heat sink. When inserts are embedded during injection moulding the inserts may have 2-dimensional or 3-dimensional form. "2-dimensional form" means that there are projections in two dimensions, and "3-dimensional form" means that there are projections in three dimensions which are not all in a same plane. With 2- and 3-dimensional forms it is possible to achieve a large surface interface for conducting the heat from the insert to the heat sink in an efficient manner. It is also possible to provide inserts with complex forms in order to achieve uniform thermal distribution within the heat sink with thermally active inserts, and in order to achieve sophisticated wiring for circuits/components with electrically active inserts. A preferable way to produce the inserts is stamping/pressing from metal sheet. This way it is possible to achieve required insert forms easily The integration density of heat generating electrical components can be made higher on top of the heat sink structure, when compared to MCPCB approach, thanks to efficient thermal connection achieved with thermally active inserts that conduct the heat vertically away to the plastic heat sink. It is possible to design the thermally active inserts in a way that they disperse the heat from small area where the electrical components are, into a larger volume with thermally active inserts that differ further away from each other inside the plastic heat sink.

Injection moulding can be done in more than one phases with more than one moulds with one or more different plastic materials with different electrical, mechanical and thermal properties.

Plastic material is preferably used in injection moulding of the heat sink. It is advantageous that the thermal conductivity of the material is high. Suitable plastic materials are e.g. LCP, polyamide 4, polyamide 46, polyamide 6, polyimide, PPS, TPE, PPA, for example. Plastic material can also be doped and/or reinforced. E.g. glass fibre reinforced plastic or plastic filled with graphite, grapheine, oxides, carbides, nitrides or any other known doping or reinforcing material can be applied.

Moulded insert heat sink provides a solution to avoid the need for planar surfaces in between the MCPCB and plastic heat sink, because the MCPCB is not used. This is thanks to direct joining between thermal inserts and opto-electrical components.

If electrically active inserts are used it is preferable that the plastic material of the heat sink is electrically insulating. This means that the electrical conductivity of the material is such that it does not get damaged due to applied voltages, it does not substantially degrade the operating performance of the electrical circuits, or cause generation of heat due to voltages at the inserts or cause potentially dangerous electrically active "live" surfaces and/or parts.

A better thermal conductivity is achieved when e.g. graphite, graphene, oxides, carbides, nitrides or other known ingredient is added to the plastic. However, this also increases the electrical conductivity of the plastic heat sink. When the injection moulding has been done in more than one phases with more than one moulds with one or more different plastic materials with different electrical, mechanical and thermal properties, then it is possible to arrange the structure in a way that thermally active inserts are moulded in a part of the mould where the injected material has high thermal conductivity and possibly electrical conductivity, and electrically active inserts are moulded in another part of the mould, where the injected material is electrically insulating and possibly poorer on thermal conductivity.

It is also possible to provide the inserts with an electrically insulating coating on other surfaces of the inserts except on the areas where electrical and/or thermal connections are made. If such coating is provided it is possible to use electrically conducting plastic for moulding the heat sink.

Electrically conducting plastic can be used when using either printed circuit board for electrical connections, insulated inserts or at least two phase moulding where electrical inserts are moulded into electrically non conductive part of the plastic heat sink.

The inserts are preferably made of metal, such as solderable copper or any other metal. The insert has preferably surface area which enables inter-metallic connection, such as soldering or bonding or any other known inter-metallic connection method like exothermic joining or chemical sintering. The insert may have such inherent material properties and/or the insert may be surface coated or electroplated to form such areas. An insert can be made solderable by coating with solderable metals by using e.g. immersion plating, chemical growing, thick film printing, thermal spraying, or other coating method. There are several possibilities for producing the inserts, such as stamping, laser cutting, chemical etching, cold forging or any other known solution from mechanical manufacturing methods. After cutting, the inserts are possibly folded into the required form of the circuit. The heat sink assembly may include only thermally active inserts, which serve only for improving thermal conductivity and thus improving the distribution of heat into the heat sink. Alternatively the heat sink may include both thermally active inserts and electrically active inserts, and it is also possible that there are inserts which are both thermally and electrically active.

The surface of the heat sink for mounting the opto-electronic components is preferably planar, and the exposed areas of the inserts for providing electrical contacts are preferably parallel with the planar surface of the heat sink. However, the demand for planar surface is different, when compared to MCPCB based approach, where the surfaces have to be strictly planar against each other, in order to provide even somewhat efficient thermal connection. Also manufacturing of tightly planar surfaces with injection moulding sets certain limits to injection moulding process, which limits can be made smaller with active thermal insert and or electrical insert approach, described in here. This allows the use of conventional automated assembly facilities for mounting and connecting the opto-electronic components, such as LEDs, bare LED dies or multi chip modules to the heat sink assembly. Such automated assembly processes include Surface Mounted Technology (SMT) process or die bonding and/or wire bonding process, for example. If only the insert areas for electrical contacts are exposed it is not necessary to use solder resist/pattering. Inter-metallic connections such as soldering and bonding are preferably used between inserts and opto-electronic components because the thermal and electrical conductivity is good.

In addition with plastic heat sink approach it is possible to meet the different requirements set by different standards and legislations related to isolation strengths, non-flammability etc. by using plastics and material thicknesses that meet these requirements. With ordinary MCPCB approach e.g. different parts like insulating washers are needed to meet the requirements.

In addition to the opto-electronic components it is also possible to provide other components at the surface of the heat sink. The metal inserts can be designed to provide a required electrical circuit and component layout for the components. If the heat sink assembly has a PCB, it is also possible to include other components to the PCB. PCB can be of MCPCB, IMS, $Al_2O_3$, LTCC, HTCC, FR4, FR2, flex, rigid flex or any other known type of PCB.

The heat sink assembly may have connections between various types of parts, such as:

a thermally and/or electrically active insert is connected to a component;

an electrically active insert is connected to another electrically active insert;

a component is connected to a PCB;

a thermally or electrically active insert is connected to a PCB;

an electrically active insert is connected directly to a lamp base or power supply; or a PCB is connected to a lamp base or a power supply.

In production of a heat sink assembly it is possible to first embed the inserts in the heat sink during the injection moulding and then connect the optoelectronic components and a possible PCB. Alternatively, it is possible to produce first a subassembly comprising of a possible PCB, optoelectronic components and the inserts. Such a subassembly can then be attached to the heat sink during the moulding of the heat sink by embedding the inserts into the heat sink and remaining the components and the possible PCB exposed.

Preferably most of a thermal insert is embedded in the plastic heat sink material, whereby preferably at least 75% of the insert is inside the heat sink material and/or at least 75% of the insert surface has an interface with the heat sink material.

A heat sink assembly according to the invention has a useful application in replacement light bulbs. A LED replacement light bulb may include AC or DC LEDs to be connected to a lamp base, with possible current limiting resistors and/or other circuitry as an additional circuitry on heat sink surface or lamp base or where suitable for application needs.

A heat sink assembly according to the invention can also be used for luminaire without replacement bulbs. In such a case a cable may be integrated to the heat sink assembly. In such implementations it is preferable to use a hollow structure of the heat sink. When a standard light bulb base is not used it is possible to use the hollow space inside the heat sink for air flow. As an outlook point of view the heat sink blades are less visible. This way it is possible to increase the ventilated surface area of the heat sink. When a standard bulb base/socket is not used it is also possible to attach the heat sink assembly directly to the luminaire structure. This way the heat is efficiently conducted to the luminaire structure and dissipated.

Further significant advantages can be achieved with the invention when compared to the prior known solutions. When the opto-electronic component is directly mounted to a metallic insert of the plastic heat sink there are no additional thermal interfaces nor poorly conductive thermal interfaces. Therefore it is possible to achieve high efficiency of thermal connection. As a consequence, higher efficiency of the opto-electronic components is achieved and/or the required number of opto-electronic components is smaller.

When the electrical connection is made with inserts, it is not necessary to provide separate wiring between the opto-electronic component and power supply. It is also not necessary to use any MCPCB or thermal interface material because the thermal contacts are provided with the inserts. If a printed circuit board is used it can be a basic low cost type.

The material and moulding cost of a plastic heat sink is low. A plastic heat sink does not require surface treatment. There are also cheap and known solutions on maximizing surface area and or emissivity of plastic surfaces, such as laser structuring, etching etc. of the mould cavity surfaces and or laser structuring, etching etc. the surfaces of moulded part. When thermally active inserts are used it is also possible to achieve the required heat dissipation with a small heat sink, thanks o the direct and efficient thermal connection. The heat sink assembly is also light in weight compared to prior art assemblies.

Conventional, automated assembly processes can be used instead of manual assembly, whereby it is possible to achieve a further significant reduction in production costs.

"Opto-electronic component" is used in this text to mean light emitting electronic components, which may be e.g. LEDs, bare LED dies, or Multi Chip Modules, lasers, super luminescent LEDs. This invention is best applied for power opto-electronic components, power dissipation of which is more than 0.25 W, preferably more than 1 W.

"Heat sink" in this text means a part or a group of parts which dissipates thermal energy created by an opto-electronic component. The heat sink may also have other purposes, it may be a part of the mechanical structure of luminaire, for example.

"Plastic heat sink" in this text means a heat dissipating part which is made of plastic by injection moulding, rotation casting or other method. The plastic heat sink may also include parts of other material than plastic. "Plastic heat sink" can be a heat dissipating surface on injection moulded structure, i.e. it is not necessarily a separate part "Embedded in a heat sink" preferably means inside the heat sink material.

"Thermally active insert" in this text means an insert which has a better thermal conductivity than the material of the heat sink it is embedded in, and which insert thus enhances heat distribution in the heat sink.

"Electrically active insert" in this text means an electrically conductive insert which serves as an electrical conductor in an electrical circuit.

"Exposing an area of an insert" means in this text that a surface area of an insert remains outside the heat sink in the injection moulding of the heat sink, or that plastic of the heat sink is removed from an area of the insert.

"Power supply" in this text means a next circuitry to be connected to electrically active inserts or PCB. The power supply can be e.g. a power supply unit, a printed circuit board between a power supply unit and the electrically active insert, or a lamp base.

SHORT DESCRIPTION OF THE DRAWINGS

Figure 2A:
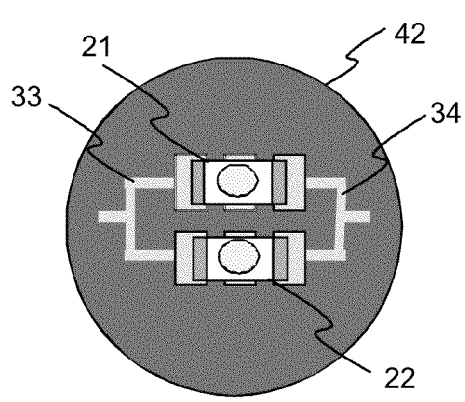
Figure 2B:
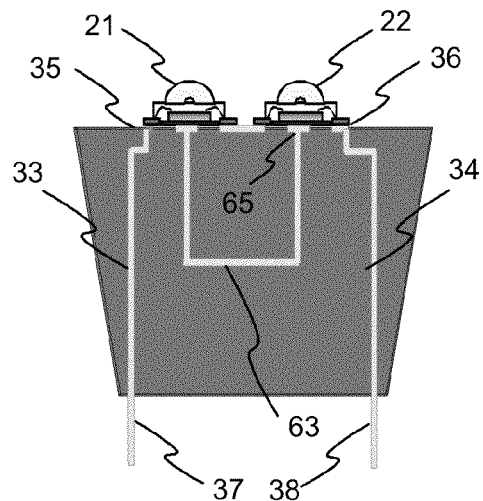
Figure 3:
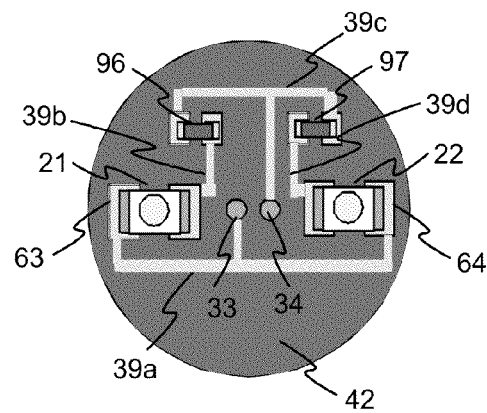
Figure 4A:
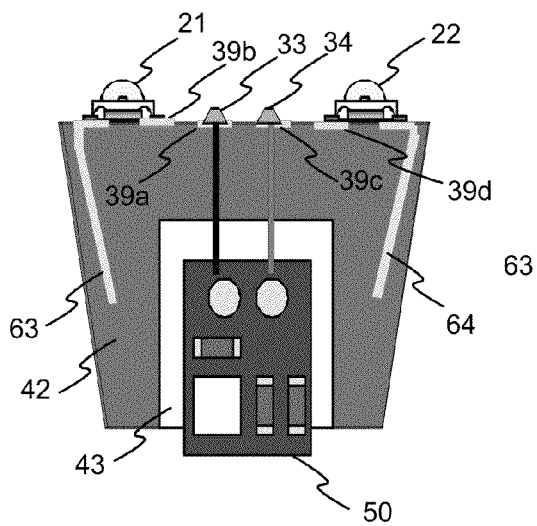
Figure 4B:
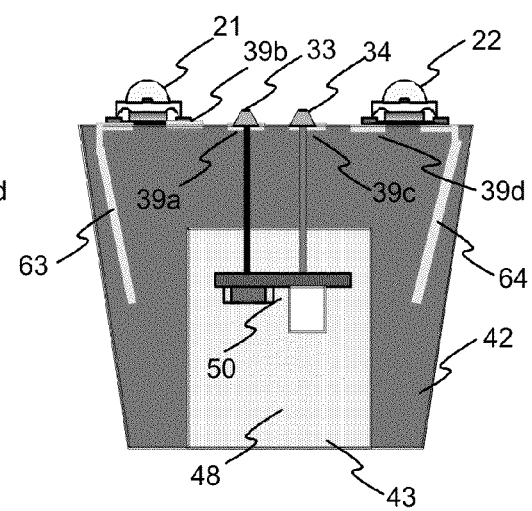
Figure 5A:
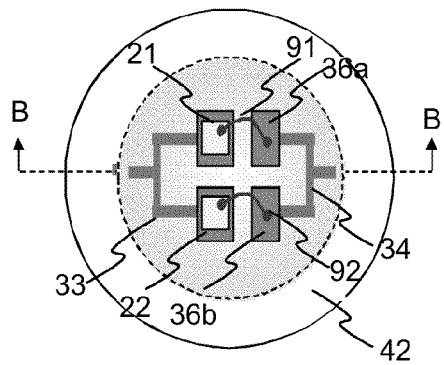
Figure 5B:
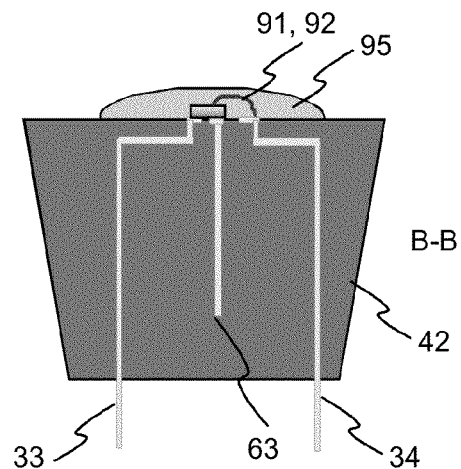
Figure 6A:
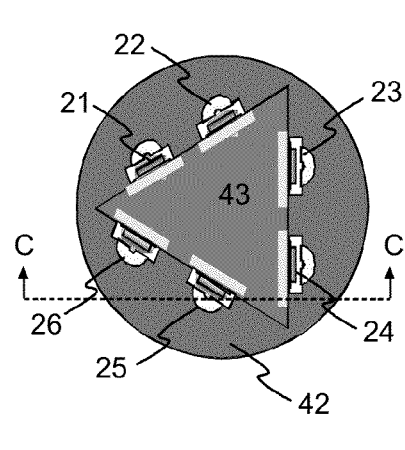
Figure 6B:
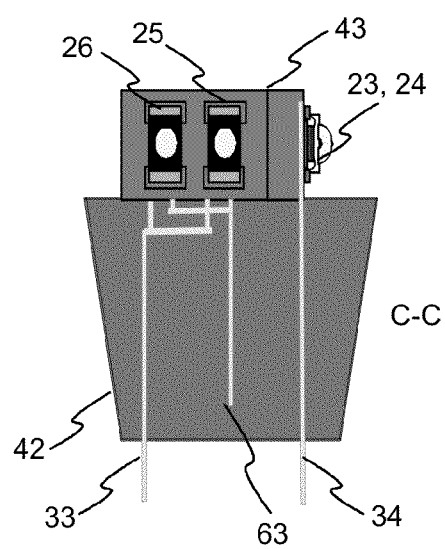
Figure 7:
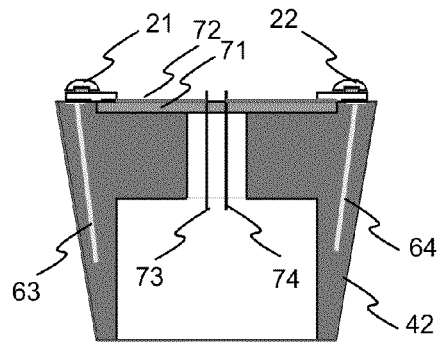
Figure 8:
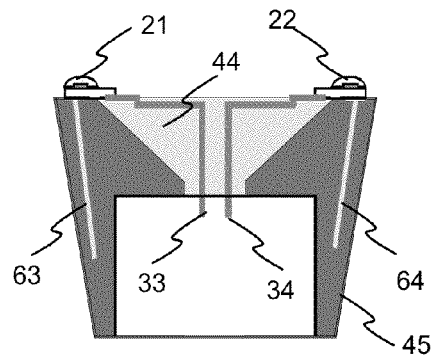
Figure 9A:
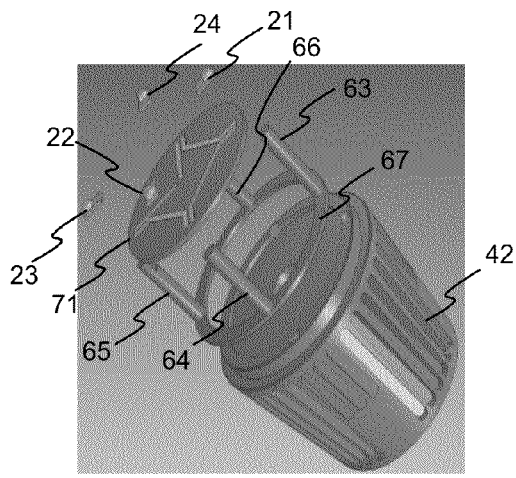
Figure 9B:
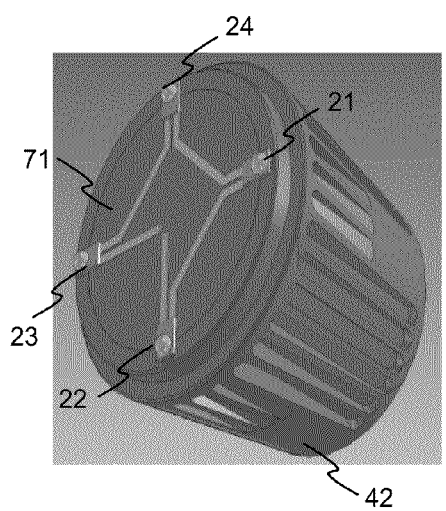
Figure 9C:
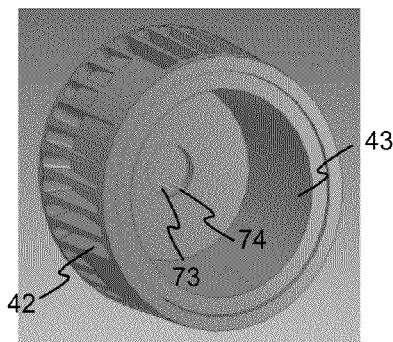
Figure 9D:
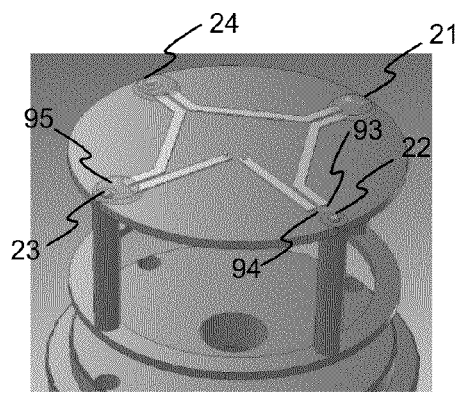
Figure 9E:
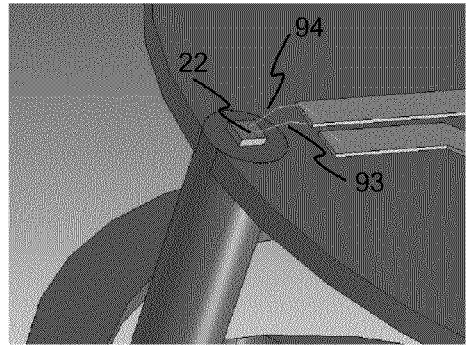
Figure 10A:
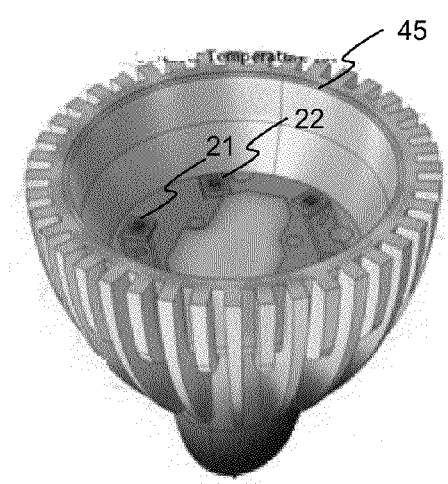
Figure 10B:
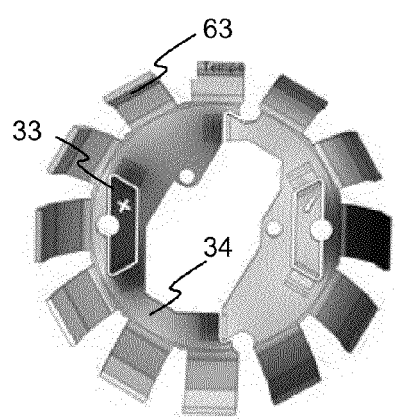

In the following part the preferable exemplary embodiments of the invention are described in more detail by referring to the enclosed drawings, in which:

FIG. 1 illustrates parts of a prior art LED replacement bulb,

FIG. 2a illustrates a top view of an exemplary heat sink assembly according to the invention for LEDs, FIG. 2b illustrates a cross section view of an exemplary heat sink assembly according to the invention for LEDs, FIG. 3 illustrates a top view of an exemplary heat sink assembly according to the invention, in which there are additional components at the heat sink surface, FIG. 4a illustrates a cross section view of an exemplary heat sink assembly according to the invention where the heat sink has a recess for placing a power supply unit, FIG. 4b illustrates a cross section view of another exemplary heat sink assembly according to the invention where the heat sink has a recess for placing a power supply unit, FIG. 5a illustrates a top view of an exemplary heat sink assembly according to the invention where LED dies are connected with die and wire bonding, FIG. 5b illustrates a cross section view of an exemplary heat sink assembly according to the invention where LED dies are connected with die and wire bonding, FIG. 6a illustrates a top view of an exemplary heat sink assembly according to the invention where six LEDs are positioned vertically, FIG. 6b illustrates a cross section view of an exemplary heat sink assembly according to the invention where six LEDs are positioned vertically, FIG. 7 illustrates a cross section view of an exemplary heat sink assembly according to the invention where electrical connection to the LEDs includes a PCB, FIG. 8 illustrates a cross section view of an exemplary heat sink assembly according to the invention where the heat sink is moulded of an electrically insulating part and an electrically conducting part, FIG. 9a illustrates an exploded view of an exemplary heat sink assembly according to the invention including a subassembly, FIG. 9b illustrates a perspective view from above of an exemplary heat sink assembly according to the invention including a subassembly, FIG. 9c illustrates a perspective view from below of an exemplary heat sink assembly according to the invention including a subassembly, FIG. 9d illustrates a perspective view from above of an exemplary heat sink assembly according to the invention including a subassembly with die components, FIG. 9e illustrates a close up view of 9d with bond wires visible, FIG. 10a illustrates a perspective view of an exemplary heat sink assembly according to the invention where the insert is made of a metal sheet, FIG. 10b illustrates an exemplary insert with a 3-dimensional form and made of metal sheet.

Figure 13B:
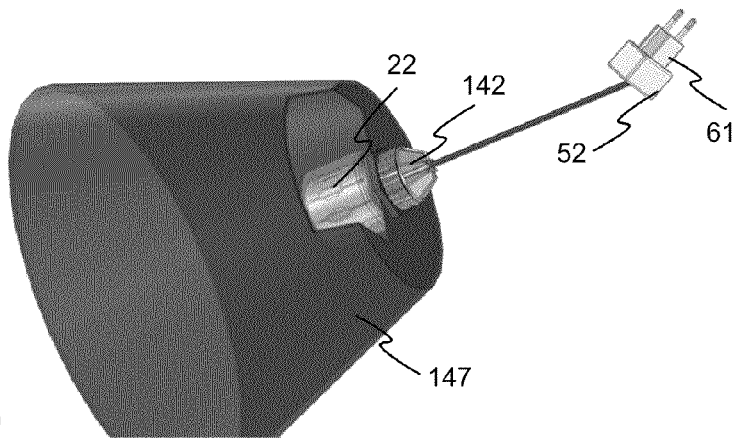
Figure 16:
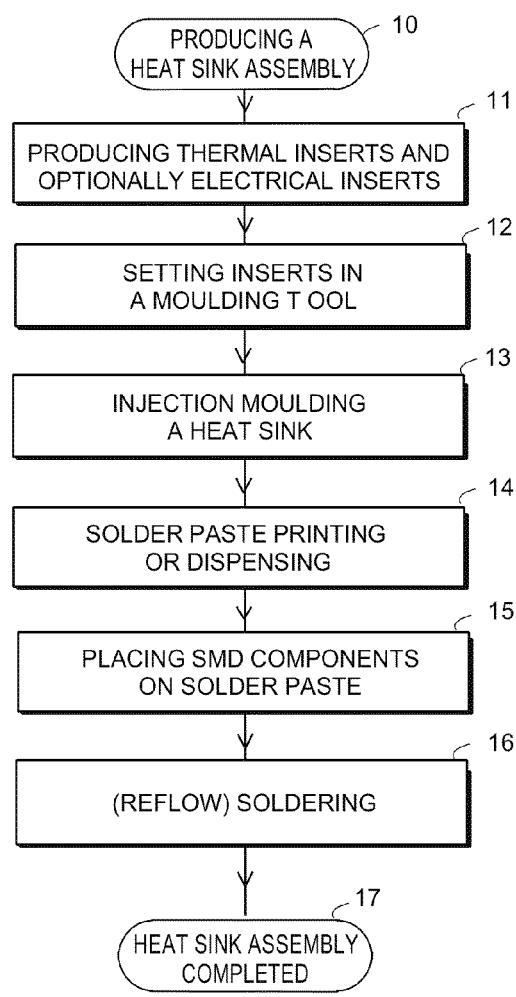

FIG. 11 illustrates an exemplary LED engine according to the invention, including a cable, FIGS. 12a and 12b illustrate a luminaire including an LED engine of FIG. 11, FIG. 13a illustrates a luminaire with a closed shade, FIG. 13b illustrates a luminaire with a bowl-type shade, FIG. 14 illustrates an exemplary luminaire with an integrated heat sink assembly according to the invention, FIG. 15 illustrates another exemplary luminaire with an integrated heat sink assembly according to the invention, FIG. 16 illustrates an exemplary method according to the invention for producing a heat sink assembly,

DETAILED DESCRIPTION OF THE EMBODIMENTS

FIG. 1 was described in the prior art description above.

FIG. 2a illustrates top view of an exemplary heat sink assembly according to the invention. FIG. 2b illustrates a cross section view of a similar exemplary heat sink assembly according to the invention. The assembly has an injection moulded heat sink 42 with a planar surface at the top. The heat sink has embedded electrical inserts 33 and 34 and embedded thermally active insert 63, which have first exposed areas 35, 36 and 65 respectively at the top surface of the heat sink. There are two LEDs 21 and 22, which are electrically connected to the exposed areas of the inserts. The electrical contacts are connected to areas 35 and 36. However, the thermally active insert area 65 can also work as an electrical contact. At the opposite surface of the heat sink, the inserts have second exposed areas 37, 38, for the connection to a power supply PCB, for example. If the thermally active insert 63 is electrically active then it will have a second exposed area for the connection e.g. to the power supply PCB. The inserts serve as electrical wiring between the opto-electronic components and a power supply/possible other electronics. The inserts also serve for conducting heat from the opto-electronic components to the heat sink. The heat sink assembly may also include inserts which are used for conducting heat but which are not used for electrical connection.

FIG. 3 illustrates a top view of a heat sink assembly, which has a plastic heat sink 42, two LEDs 21, 22, and two additional components 96, 97. The additional components may be e.g. capacitors, resistors, inductors, transistors, integrated circuits, sensors like ambient light sensor etc. There are also additional electrically active inserts 39a-39d for providing required conductors for the circuit, thus connecting the power supply wires 33 and 34, LEDs 21 and 22, as well as components 96 and 97 electrically to form a circuit. It is thus possible to provide electronic circuits including other components on the heat sink assembly in addition to the optical components.

There are also thermally active insert parts 63 and 64 (see also FIGS. 4a and 4b), preferably forming a uniform insert with the insert part 39a, which connects electrodes of the LEDs. The parts 63 and 64 of the insert are thus not electrically active, while the part 39a of the insert is electrically active. Part 39a of the insert can be partly embedded in the heat sink. It is thus also possible to provide combined thermally active insert and electrically active insert, and this can be done on every structure following the idea of this invention. Combined inserts have e.g. straight electrically active insert part and free form thermally active insert part to disperse the heat evenly into the heat sink.

FIGS. 4a and 4b illustrate cross section views of two exemplary heat sink assemblies where the plastic heat sink has a recess 43 for placing a power supply unit 50. The power supply unit is connected to the inserts 33 and 34, which serves for both electrical and mechanical connection of the power supply unit. When the power supply unit is inside the heat sink, the heat sink may also dissipate heat from the power supply unit. This can be enhanced by suitable filling material 48, like epoxy or any other known filler. The power supply can be also over-molded part inside the heat sink. The heat sink assemblies of FIGS. 4a and 4b have also thermally active inserts 63 and 64. The assembly of FIG. 3 may be the same as illustrated in FIG. 4a or FIG. 4b.

FIG. 5a illustrates a top view of an exemplary heat sink assembly where a LED dies 21, 22 are bonded to inserts 33, 34 and possible thermally active insert 63 of a heat sink 42. If there are no separate thermally active inserts, then either 33 or 34 or both functions also as a thermally active insert. FIG. 5*b* illustrates a cross section view of the same. The LED dies have first been positioned and bonded, glued or soldered on exposed pads of the insert 33. The second electrodes of the LEDs have then been wire bonded 91, 92 to an exposed pads 36*a*, 36*b* of the insert 34.

There are several types of dies, one have both electrical connections on top surface, and wire bonding is preferred method for contacting the areas, and the thermal interface on these kind of dies is then the bottom of the die, from which the die will be die bonded, wire bonded, glued or soldered to the thermally active insert 63. Other kind of dies are the dies that have both connections on the bottom, and which do not demand any bond wires. With these kind of dies there can be separate thermal connection, which is connected to the thermally active insert by inter-metallic connection utilizing e.g. die bonding, wire bonding, gluing or soldering, or there are no thermal connection on the bottom of the die, and then one or many of the electrical connections functions also as thermal connection to the heat sink.

There are also dies having one electrical connection at the top of the die and the other connection is at the bottom. For the top contact wire bonding is preferred method for contacting, whereas the bottom contact is preferably done by some inter-metallic connection method e.g. by die bonding, gluing or soldering. With these kind of dies there can be separate thermal connection, which is connected to the thermally active insert by die bonding, wire bonding, gluing or soldering, or there are no thermal connection on the bottom of the die, and then one or many of the bottom side electrical connections functions also as thermal connection to the heat sink.

It is also possible that dies have more than two electrical connections and/or many thermal connection points, which can be attached to the heat sink structure utilizing the methods described above.

Finally, the dies have possibly been encapsulated 95 with silicone phosphor, for example, using a dispensing system. Other encapsulants can be also used, like standard transparent silicone, with e.g. remote phosphor or some other known optical solution to adjust the wavelengths.

FIGS. 6*a* and 6*b* illustrate a top view and a cross section view of an exemplary heat sink assembly where six LEDs 21-26 are positioned vertically. The heat sink 42 has a triangular protrusion 43 with three vertical surfaces for the attachment of the LEDs. The electrical connections for LEDs 21, 22 are made with inserts 33, 34. The heat sink assembly may have a separate thermally active insert 63, and/or electrically active inserts 33 and/or 34 may also function as thermally active inserts. The thermally active insert 63 has a separate connection to the LEDs at the bottom of the LEDs. This thermally active insert is not electrically active. It is also possible to provide a reflecting and/or diffusive coating on the surfaces where the LEDs are attached.

FIG. 7 illustrates an embodiment where electrical wiring for LEDs 21, 22 is provided with a printed circuit board 71, which has an electrically conductive patterned layer 72. The heat sink has a recess for the PCB, and the depth of the recess is such that the horizontal surface of the heat sink edge and/or top surface of thermally active insert and the upper surface of the PCB are substantially on the same level. This facilitates the attachment of the LEDs 21, 22 both on the thermally active insert and on the pads of the PCB. The wiring is further led from the PCB to power supply with wires 73 and 74, which are electrically and mechanically connected to the PCB. This embodiment has separate thermally active inserts 63 and 64. The thermally active inserts can also be electrically active, when they can be connected to other circuitry consisting of PCB subassembly. This is not shown on FIG. 7, but it is obvious that it can be done with the heat sink structure described in here. This cannot be done or is really difficult to do with ordinary MCPCB kind of an approach presented on FIG. 1.

FIG. 8 illustrates a further embodiment in which the heat sink is moulded using two different materials. Part 44 is moulded of electrically insulating material, and the electrically active inserts 33 and 34 are embedded into this area. Part 45 of the heat sink is moulded of thermally conductive material, which can also be electrically conductive in order to achieve better thermal conductivity. Thermally active inserts 63 and 64 are embedded into this part 45. Due to the possible electrical conductivity of the moulded material in part 45 the thermally active inserts 63 and 64 are preferably not used as electrically active inserts, i.e. they are electrically passive. The two parts of the heat sink are preferably moulded in two successive phases. There can of course be more phases and/or phases can be also non successive of moulding if the solution demands this, and solution is following the basic idea of this invention.

FIGS. 9*a*-9*d* illustrate further embodiments which have a subassembly. The embodiment of FIGS. 9*a*-9*c* has LEDs 21-24 which are electrically connected to wiring of a PCB 71. The LEDs are also attached to bars 63-66 of a thermally active insert. The thermally active insert also includes a frame 67 joining the bars at their ends, and/or for more even heat distribution into heat sink 42. The thermal insert has thus 3-dimensional form, i.e. it has projections in three dimensions. Such a structure of the thermally active insert distributes the heat from the LEDs in an efficient manner. There are also pins 73, 74 in the PCB for electrical connection to a power supply. Pins 73, 74 are possibly located inside the recess 43.

FIGS. 9*d* and 9*e* illustrate a subassembly where the opto-electronic components 21-24 are bare LED dies. The dies are attached to the bar ends of the thermally active insert, and the die electrodes are die bonded and/or wire bonded with wires 93, 94 to pads of the PCB. FIG. 9*e* shows a close up view showing bonding wires. After the bonding, the dies have been encapsulated 95 with transparent silicon phosphor, for example.

After the subassembly is assembled, the heat sink 42 is injection moulded so that the thermally active insert of the subassembly is embedded inside the heat sink, except the bar ends with the opto-electronic components which remain exposed on the heat sink. Alternatively, it is also possible to first embed the thermally active insert in the heat sink during the injection moulding, and to attach the PCB and optoelectronic components after the injection moulding.

FIG. 10*a* illustrates a further embodiment of a heat sink assembly according to the invention, and FIG. 10*b* illustrates a corresponding insert. The insert is made of thin metal sheet and has large area for transferring heat to from the LEDs 21, 22 to the plastic heat sink part 45. The insert has an isolated area 33 for anode connection voltage and this part of the insert is thus electrically active. The rest of the insert is both electrically active as a cathode electrode and thermally active. The insert has folded fins 63 which are thermally active, conducting heat to the plastic heat sink part.

FIG. 11 illustrates a further embodiment of the heat sink assembly according to the invention. The heat sink has a hollow structure with a form of a cylinder. The heat sink is inside an optical part 145. The optical part may be replaceable. The optical part may also be used for attaching the assembly to the luminaire. The hollow structure allows air to flow through the heat sink, whereby the surface area dissipating heat is large and the distance that the heat must travel through to the heat dissipating surface is very short. The LEDs 22 are located at the outer surface of the heat sink. The inserts 33 may be both electrically and thermally active. The heats sink assembly also has an integrated cable 51 for supplying power. There is a power supply circuit 52 and mains plug 61 at the other end of the cable. The power supply 52 can be located at either end of the cable or it can be a separate part in the middle of the cable. However, when the power supply is not near to the LEDs the power supply does not heat the LEDs and vice versa. It is also possible to use LEDs which can operate with AC, whereby a separate power supply is not required. This structure allows good air flow for the heat sink as there is no standard bulb base in the assembly and the air flow is not disturbed. It is easily understood on the basis of FIG. 12a that a conventional LED replacement bulb totally blocks the air flow in the middle part 121 of the luminaire/heat sink.

The LED engine with cable could be a part of vast majority of the existing luminaire designs using standardized sockets. The dimensions of the LED engine are such that it fits into standardized shade hole sizes or provides standardized fixings for luminaire stands. The mechanical fixing of the cable can be done with bolts, or e.g. with optical part 145 of the LED engine, which would allow the easy assembly of the cable. Optical part can provide different optical functions. It can be opaque, diffractive, reflective, directive etc. The LED engine with cable removes the extra thermal interfaces caused by the MCPCB, and lamp base and sockets. At the same time LED engine with cable allows different designs for different luminaire shade models. Inserts that conduct the heat to the luminaire shade through the mechanical fixing is a useful solution on bowl type, air flow blocking shades. Another solution for these shades are the tubular LED engines with cable.

FIGS. 12a and 12b illustrate luminaires where the heat sink assembly with a cable or "LED engine" of FIG. 11 is used. The luminaire has a shade 148 with a hollow structure, thus allowing air flow through the shade 122 and the heat sink 121.

FIG. 13a illustrates a luminaire where the shade 149 has a closed structure, i.e. there is no air flow between the inside and outside of the shade. The part 142 of the heat sink, however, remains outside the shade and thus improves heat dissipation in such a luminaire implementation. The thermally active inserts of the heat sink assembly conduct heat from the LEDs to the bottom area 142 of the heat sink for further dissipation. In a corresponding luminaire using conventional LED bulb the heat sink is located totally inside the shade and therefore the heat dissipation from the inner volume of the shade is poor.

FIG. 13b illustrates a luminaire with a bowl-type shade 147. When a conventional base/socket type LED is used, there is no possibility for vertical air flow. The LED engine according to the invention may have thermally active inserts for conduct the heat from the LEDs to the part 142 of the heat sink, which extends on the outside/above the shade. The heat may also be conducted to the shade of the luminaire by the thermally active inserts. Further, there may be an opening in the middle of the heat sink, offering an aperture for the air flow.

FIGS. 14 and 15 illustrate exemplary luminaires in which the heat sink is integrated within the structure of the luminaire, i.e. heat sink is not a separate part. In the luminaire of FIG. 14 the heat sink assembly has a form of a circle, including electrically and thermally active inserts 33 and LEDs 22 inside a shade of the luminaire. The stand of the luminaire is used for dissipating heat. The heat is also conducted to the luminaire shade, which thus serves for dissipating heat as well. The plastic parts may be injection moulded or rotation casted, for example. The power supply 52 may be located at the mains plug or it may locate in the stand of the luminaire, for example. As the FIG. 14 shows, no lamp base/socket nor printed circuit boards are required in the structure.

In the luminaire of FIG. 15 the heat sink has a form of a hollow cylinder with vertical inserts 63. The LEDs are located at the outer surface of the heat sink. The shade 148 is hollow allowing air flow. The air flow is also possible through the heat sink via holes 149. As can be seen in the Figures, the heat sink is also a visually integrated part of the luminaire design.

FIG. 16 illustrates a flow diagram of an exemplary embodiment of a method 10 for producing a heat sink assembly according to the invention. Thermally active inserts and possible electrically active inserts of metal are first produced in phase 11. The electrically and thermally active inserts may be separate with separate connections to LEDs, or same inserts may serve as both electrically and thermally active inserts. A set of inserts is applied into a moulding tool in phase 12, and a heat sink is then injection moulded from plastic, whereby the inserts will become at least partly embedded inside the heat sink, phase 13. The injection moulded heat sink has a surface with insert areas exposed for the connection of components. A solder paste is printed or dispensed into the required, exposed areas in phase 14. SMD components are then placed on the solder paste, phase 15, and the assembly is e.g. reflow soldered, phase 16. The heat sink assembly is thus completed, 17. If dies are used instead of SMD components, it is possible to use die bonding and/or wire bonding as described in the description of FIGS. 5a, 5b.

The invention has been described with the reference to the enclosed embodiments. It is, however, clear that the invention is not restricted only to those, but it comprises all embodiments which can be imagined within the enclosed patent claims.

For example, it is clear that the discussed materials of the heat sink and the inserts are mentioned as examples, it is naturally possible to use other materials as alternatives.

For example, order of manufacturing steps presented in FIG. 10 can be varied.

The invention claimed is:

1. A heat sink assembly for dissipating heat from a replacement LED, wherein the heat sink assembly comprises:
   an injection moulded, plastic heat sink with a heat dissipating plastic heat sink surface and emissivity;
   at least one combined thermally and electrically active insert, the at least one combined insert comprising a thermally active part that is not electrically active having a free form shape and an electrically active part;
   at least one electrically active insert;
   the at least one combined insert and the at least one electrically active insert providing an interface with the plastic heat sink, the interface configured to conduct and disperse heat from the at least one combined insert and the at least one electrically active insert to the plastic heat sink;
   a first exposed area at a surface of the at least one combined insert and the at least one electrically active insert for thermal and electrical connection to the replacement LED;
   a power supply disposed in a recess of the plastic heat sink; and
   a second exposed area on a surface of the at least one combined insert and at the least one electrically active insert for electrical connection to the power supply;

wherein a thermal connection from the first exposed area for connecting the replacement LED to the surface of the plastic heat sink comprises the at least one combined insert and plastic heat sink material.

2. The heat sink assembly according to claim 1, wherein the heat sink assembly comprises at least one SMD component connected to the first exposed area.

3. The heat sink assembly according to claim 2, comprising an inter-metallic connection, between the at least one SMD component and the first exposed area.

4. The heat sink assembly according to claim 1, wherein the assembly comprises an optics portion.

5. The heat sink assembly according to claim 4, wherein the optics portion of the heat sink assembly mechanically fixes the heat sink assembly to a luminaire structure.

6. The heat sink assembly according to claim 1, wherein the assembly further comprises a power supply cable integrated with the assembly.

7. The heat sink assembly according to claim 6, wherein the assembly further comprises a power supply and a mains voltage plug at the other end of the power supply cable.

8. The heat sink assembly according to claim 1,
wherein the at least one combined insert is embedded at least partly inside the heat sink.

9. The heat sink assembly according to claim 1, wherein the free form of the at least one thermally active part has a form with projections in at least two dimensions.

10. The heat sink assembly according to claim 1, wherein the material of the injection moulded heat sink has a melting temperature or glass transition temperature of at least 150 degrees C.

11. The heat sink assembly according to claim 1, wherein for mounting one or several components the heat sink has a planar surface of there is a printed circuit board on the heat sink, and the first expose area of the thermally active part is substantially on the same level with the surface of the heat sink or the printed circuit board.

12. The heat sink assembly according to claim 1, wherein the heat sink assembly has at least one SMD component connected with SMD technology to the first exposed area.

13. The heat sink assembly according to claim 1, wherein the assembly has at least one die component, which is die and/or wire bonded to the first exposed area.

14. The heat sink assembly according to claim 1, wherein the assembly comprises a printed circuit board, whereby an opto-electronic component is attached to the combined insert for heat coupling, and the optoelectronic component is further coupled to the printed circuit board for an electrical connection.

15. The heat sink assembly according to claim 1, whereby at least 75% of the combined insert is inside the heat sink material or at least 75% of the combined insert surface has an interface with the heat sink material.

16. The heat sink assembly according to claim 1, wherein the assembly includes a hollow area configured for air flow through the heat sink.

17. A method for producing a heat sink assembly for a replacement LED, comprising:
forming an injection moulded plastic heat sink structure;
forming a heat dissipating surface area;
producing at least one combined thermally and electrically active insert, wherein the combined insert comprises a thermally active part that is not electrically active having a free form shape and an electrically active part;
producing at least one electrically active insert,
the at least one combined insert and the electrically active insert forming an interface with the plastic heat sink material for heat dispersion and conduction;
wherein at least two first exposed areas at surfaces of the at least one combined insert and the electrically active insert are configured to provide electrical and thermal connections to the replacement LED;
embedding the at least one combined insert and electrically active insert the at least partly inside the heat sink, wherein the at least one combined and at least one electrically active embedded inserts are configured to provide a first exposed area at the surface of the at least one combined and at least one electrically active embedded inserts for electrical connection to the replacement LED;
directly soldering the replacement LED to the first exposed areas of the at least one combined and at least one electrically active inserts;
providing second exposed areas at the at least one combined and the at least one electrically active insert for electrical connection to a power supply printed circuit board;
providing a recess in the heat sink structure for a power supply unit, the recess being configured to provide the second exposed areas for electrical connection to the power supply printed circuit board; and
wherein a thermal connection from the exposed heat sink area for connecting the replacement LED to the heat sink surface comprises the at least one combination insert and plastic heat sink material.

18. The method according to claim 17, comprising:
producing the at least one electrically active insert from electrically conductive material,
embedding one or more of the at least one combined and electrically active inserts at least partially inside the heat sink during a phase of injection moulding,
exposing the first area of the electrically active insert for providing an electrical contact between the electrically active insert and the opto-electronic component or another component, and
exposing the second area of the electrically active insert for providing a contact to another component, wire or printed circuit board.

19. The method according to claim 17, comprising using metal as a material to produce the at least one combined insert.

20. The method according to claim 17, comprising using metal to produce the at least one electrically active insert.

21. The method according to claim 17, comprising using a material having a melting temperature or glass transition temperature of at least 150 degrees C. in the injection moulding of the heat sink.

22. The method according to claim 17, comprising connecting SMD components with SMD soldering technology to the exposed areas of the inserts.

23. The method according to claim 17, comprising attaching the replacement LED to at least one of the inserts before the insert is embedded into the heat sink.

24. The method according to claim 17, comprising:
moulding a first part of the heat sink of electrically insulating material and embedding at least one of the electrically active inserts into the first part; and
moulding a second part of the heat sink of electrically conductive material and embedding at least one of the combined inserts into the second part.

25. The method according to claim 17, wherein the heat sink is integrated in a luminaire.

* * * * *